United States Patent
Ikeda

(10) Patent No.: US 7,508,279 B2
(45) Date of Patent: Mar. 24, 2009

(54) RESONANCE CIRCUIT WITH VARIABLE DIODES

(75) Inventor: Youichi Ikeda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 85 days.

(21) Appl. No.: 11/499,869

(22) Filed: Aug. 7, 2006

(65) Prior Publication Data

US 2007/0035352 A1 Feb. 15, 2007

(30) Foreign Application Priority Data

Aug. 9, 2005 (JP) .............................. 2005-231120

(51) Int. Cl.
*H03B 5/12* (2006.01)
(52) U.S. Cl. .......................... 331/117 R; 331/117 FE; 331/177 V; 331/36 C; 331/167; 334/78
(58) Field of Classification Search ................ 331/167, 331/117 FE, 117 R, 177 V, 36 C; 334/78
See application file for complete search history.

(56) References Cited

U.S. PATENT DOCUMENTS 7,015,768 B1 * 3/2006 Talwalkar ............... 331/177 V

FOREIGN PATENT DOCUMENTS

| JP | 63-211913 | 9/1988 |
| JP | 05-218893 | 8/1993 |

* cited by examiner

*Primary Examiner*—Arnold Kinkead
(74) *Attorney, Agent, or Firm*—Morrison & Foerster LLP

(57) ABSTRACT

A resistance having a high impedance is connected between anode terminals of two variable capacitance diodes sharing a cathode, and the components described above are sealed in one package. The resistance can be formed of a diffusion region between p-regions of the variable capacitance diodes or can be formed of polysilicon and disposed on a chip. Thus, the resistance can be mounted while a chip size of the variable capacitance diode is maintained. Accordingly, it is not required that a bias resistance having a high impedance is additionally provided, whereby achieving reduction in the substrate mounting area and reduction in costs of the set.

4 Claims, 4 Drawing Sheets

Prior Art

Prior Art

RESONANCE CIRCUIT WITH VARIABLE DIODES

BACKGROUND OF THE INVENTION

Priority is claimed to Japanese Patent Application Number JP 2005-231120 filed on Aug. 9, 2005, the disclosure of which is incorporated herein by reference in its entirety.

1. Field of the Invention

The present invention relates to a variable capacitance diode, and more particularly relates to a variable capacitance diode which can contribute to reduction in a substrate area and in costs of an installation thereof when the variable capacitance diode is included.

2. Description of the Related Art

FIGS. 4A and 4B are views showing an example of a conventional variable capacitance diode. FIG. 4A is a circuit diagram and FIG. 4B is a plan view.

As shown in FIG. 4A, a variable capacitance diode D formed of two variable capacitance diodes D1 and D2 is a three-terminal element in which a common cathode terminal CA formed by common connection of respective cathodes of the diodes, and respective anode terminals A1 and A2 of the diodes are drawn to the outside.

FIG. 4B is a plan view showing an example where the foregoing variable capacitance diode D is integrally formed on a silicon substrate.

The variable capacitance diode D is formed by fixing a chip 23 to a lead frame 24 or the like and then by sealing the chip 23 and the lead frame 24 with a package 25 such as a resin layer. Specifically, in the chip 23, two p⁻ type impurity regions 22 to be anodes are provided in an island manner on an n⁻ type semiconductor substrate 21 to be a cathode. By disposing the p⁻ type impurity regions 22 of the two variable capacitance diodes D1 and D2 on the same n⁻ type semiconductor substrate 21, the circuit shown in FIG. 4A is realized. As external terminals, the common cathode terminal CA and the two anode terminals A1 and A2 are drawn to the outside of the package 25.

FIGS. 5A and 5B are views each showing an LC resonant circuit using the foregoing variable capacitance diode D. Each of FIGS. 5A and 5B shows a circuit diagram, as an example, in the case where a tuning circuit is formed by use of a tuner IC or the like.

FIG. 5A shows an example of an oscillator tuning circuit (frequency selection circuit). This circuit includes a variable capacitance diode D in which the cathodes of the two variable capacitance diodes D1 and D2 shown in FIGS. 4A and 4B are connected to each other and a predetermined voltage VT is applied through a resistance R1. In this case, the second anode terminal A2 of the variable capacitance diode D2 and the first anode terminal A1 of the variable capacitance diode D1 are at potentials lower than that of the voltage VT applied to the common cathode terminal CA. Thus, the second anode terminal A2 is directly grounded, and the first anode terminal A1 is grounded through a resistance Rb. One end of a capacitor Cb is connected to the first anode terminal A1, one end of a coil L1 is connected to the other end of the capacitor, and one end of a capacitor C1 is connected to the other end of the coil L1. Moreover, the other end of the coil L1 is connected to a terminal B, and the other end of the capacitor C1 is grounded.

Accordingly, a parallel LC resonant circuit is configured of a combined capacitance obtained by series connection of the variable capacitance diodes D1 and D2 and the capacitors Cb and C1, and inductance of the coil L1. A resonance frequency of a desired receiving frequency is selected with the voltage VT applied to the variable capacitance diode D, and is inputted to the IC.

The capacitor Cb is connected for cutting a direct current. Thus, a bias applied from the terminal B is prevented from flowing toward the variable capacitance diode D. Meanwhile, a high-frequency signal is inputted from the terminal B and flows into the IC. Although the high-frequency signal also flows toward the variable capacitance diode D through the capacitor Cb, part of the signal leaking into the ground through the high resistance Rb is very little and thus can be ignored. This technology is described, for instance, in Japanese Patent Application Publication No. Hei 5 (1993)-218893.

Moreover, FIG. 5B shows an example of a circuit for three-point tracking by use of an element including two variable capacitance diodes in one package with a common cathode terminal.

This circuit is configured, for example, of a receiver tuning circuit and an oscillator tuning circuit in one package. In the circuit, LC resonant circuits are connected to respective output terminals of two anode terminals A1 and A2 of a variable capacitance diode D.

The second anode terminal A2 is connected to one end of a capacitor Co and one end of a resistance Ro having a high resistance value. The other ends of the capacitor Co and the resistance Ro are grounded, respectively. Here, in the LC resonant circuit (Lo, Cp, Co, A2, Cg and C1) on the second anode terminal A2 side, a padding capacitor Cp for correcting tracking properties is serially connected between a coil Lo and the variable capacitance diode D.

Meanwhile, the first anode terminal A1 is connected to one end of a capacitor Cr and one end of a coil Lr, and the other ends of the capacitor Cr and the coil Lr are grounded, respectively. Moreover, the coil Lr is connected to the IC through a capacitor Cc for cutting a direct-current bias.

A potential VT is applied to a common cathode terminal CA of the variable capacitance diode D, and a capacitance varies. Moreover, the common cathode terminal CA is grounded through a capacitor Cg. Specifically, at an input terminal of the common cathode terminal CA, the direct-current bias is at a positive potential (H level), and a high-frequency signal has a GND potential (L level).

In the variable capacitance diode used in the tuning circuit, the potential VT higher than those of the first and second anode terminals A1 and A2 is applied to the common cathode terminal CA. Thus, a circuit configuration in which the first and second anode terminals A1 and A2 are grounded (the GND potential) is generally adopted.

However, a high-frequency signal is inputted to a signal line to which the first anode terminal A1 or the second anode terminal A2 is connected. Therefore, for example, in the oscillator tuning circuit, the first anode terminal A1 or the second anode terminal A2 is grounded through the resistance Rb or Ro, each of which has a high resistance value, to prevent a leak of the high-frequency signal (FIGS. 5A and 5B). In the receiver tuning circuit, any of the anode terminals is grounded through the coil Lr to prevent a leak of the high-frequency signal (FIG. 5B).

Moreover, in the LC resonant circuit, the signal line side connected to the input terminal to the IC is set at the H level of the high-frequency signal. Therefore, the terminals of the LC resonant circuit on the side not connected to the input terminal to the IC (the terminals opposite to the terminals on the IC side among the terminals on both ends of the coils L1, Lo and Lr) are grounded and set at the L level of the high-frequency signal. In addition, since the direct-current bias is also inputted to the signal line at the L level, the direct-current bias is cut by connecting the capacitors Cl, Co and Cr.

In the case of FIG. 5A, the coil L1 included in the LC resonant circuit can be realized with a coil (solenoid) having a simple structure. However, the resistance Rb is required in order to ground the first anode terminal A1 of the variable capacitance diode D in series. Specifically, a connection point P' for grounding the first anode terminal A1 is on the signal line in which the high-frequency signal is at the H level. Thus, it is required to prevent the leak of the high-frequency signal by connecting the resistance Rb, and to ground the first anode terminal A1. Consequently, there is a problem that increases in the number of components and in a substrate area are inevitable and costs for the set are increased.

Meanwhile, in the circuit shown in FIG. 5B, the first anode terminal A1 is grounded for direct current through the coil Lr. However, the signal line to which the second anode terminal A2 is connected cannot be grounded since the direct-current bias is cut by the padding capacitor Cp. Therefore, a connection point P is provided between the padding capacitor Cp and the second anode terminal A2, and the second anode terminal A2 is grounded. However, since the connection point P is on the signal line in which the high-frequency signal is at the H level, it is required that the high resistance Ro be connected for preventing the leak of the high-frequency signal. Therefore, also in this case, the increases in the number of components and in the substrate area lead to the increase in costs of the set.

SUMMARY OF THE INVENTION

The present invention provides a device that includes two variable capacitance diodes, each of the diodes comprising an anode terminal and a cathode terminal, and the cathode terminals being connected with each other, and a resistance element connecting the anode terminals.

The present invention also provides a device that includes an LC resonant circuit comprising, two variable capacitance diodes, each of the diodes comprising an anode terminal and a cathode terminal, and the cathode terminals being connected with each other, a resistance element connecting the anode terminals, and an LC element connected with one of the anode terminals.

DESCRIPTION OF THE EMBODIMENTS

Figure 1A:
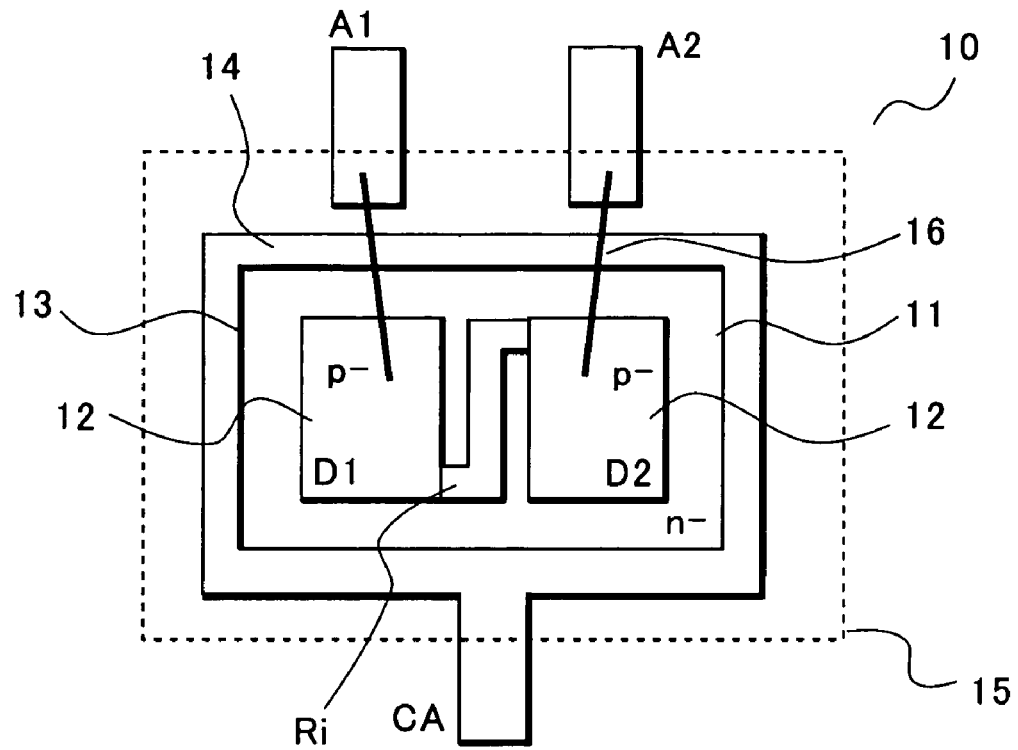
FIG. 1A is a plan view and FIG. 1B is a circuit diagram each showing an embodiment of the present invention.
Figure 1B:
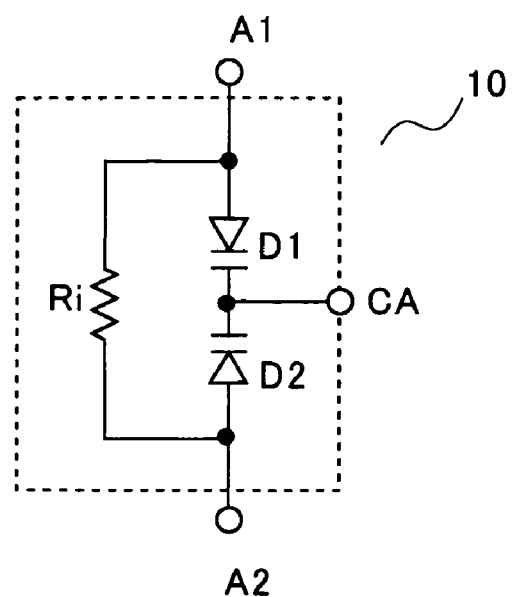
Figure 2:
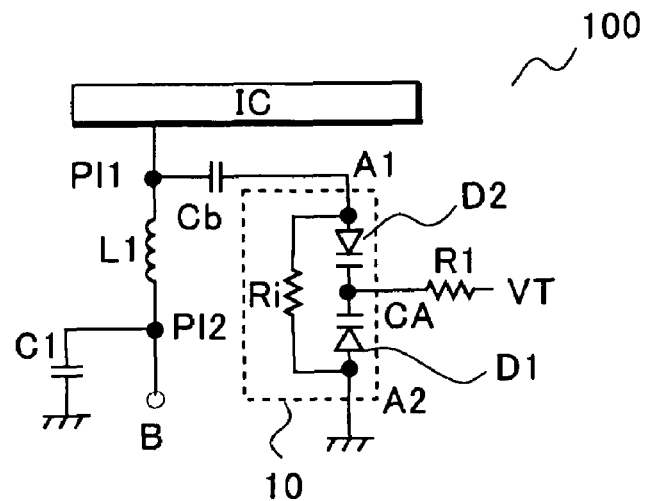
FIG. 2 is a circuit diagram showing the embodiment of the present invention.
Figure 3:
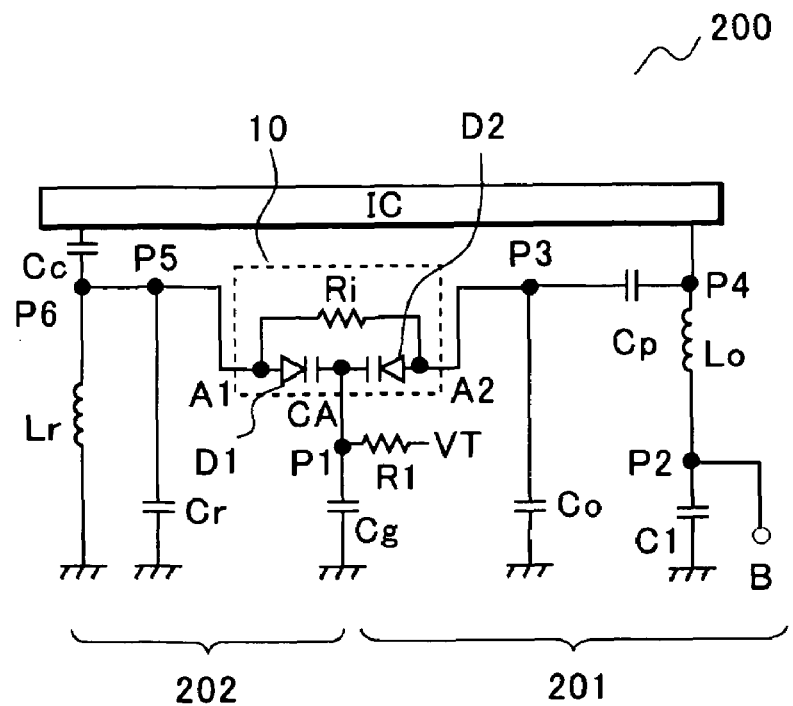
FIG. 3 is a circuit diagram showing the embodiment of the present invention.
Figure 4A:
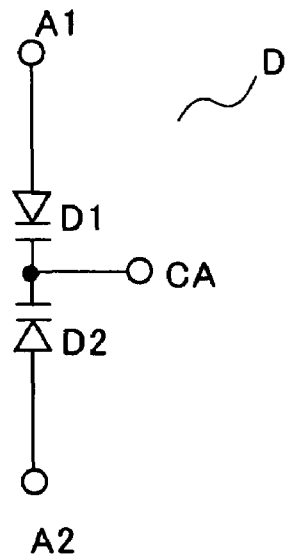
FIG. 4A is a circuit diagram and FIG. 4B is a plan view showing a conventional technology.
Figure 4B:
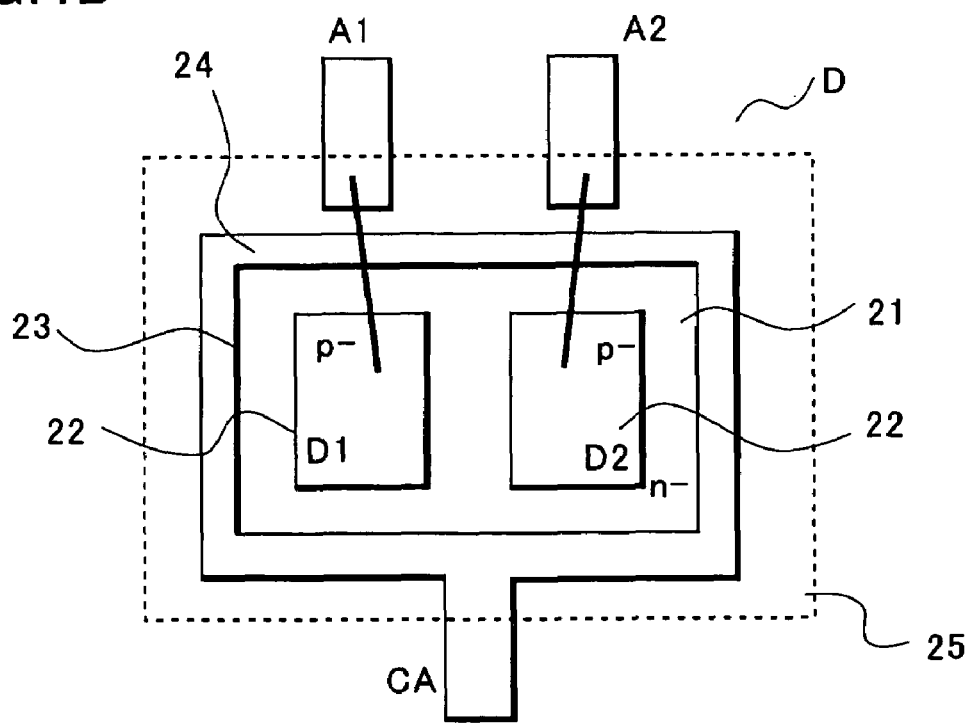

With reference to FIGS. 1 to 3, an embodiment of the present invention will be described in detail below.

FIGS. 1A and 1B show a variable capacitance diode of this embodiment. FIG. 1A is a plan view and FIG. 1B is an equivalent circuit diagram.

A variable capacitance diode 10 is formed by integrating two variable capacitance diodes D1 and D2 and a resistance Ri on an one chip 13 and by sealing those components as one package.

In the chip 13 of the variable capacitance diode, two $p^-$ type impurity regions 12 to be anodes are provided in an island manner by diffusing impurities and the like on an $n^-$ type semiconductor substrate 11 to be a cathode. The $p^-$ type impurity regions 12 form pn junction diodes with the $n^-$ type semiconductor substrate 11, respectively. In other words, the two variable capacitance diodes D1 and D2 are integrated on the one chip 13 by using a common cathode.

The chip 13 is mounted, for example, on a lead frame 14 having three terminals. Specifically, the $n^-$ type semiconductor substrate 11 is fixed to an island of the lead frame 14. Thereafter, the two $p^-$ type impurity regions 12 are electrically connected to two leads, respectively, through metal electrodes (not shown), bonding wires 16 and the like. A lead continuous with the island serves as a common cathode terminal CA, and the other two leads serve as first and second anode terminals A1 and A2, respectively. All the terminals are drawn to the outside.

Together with a part of the lead frame 14, the chip 13 is completely covered and protected with a resin layer 15 such as an epoxy resin, for example, by transfer molding. Thus, the variable capacitance diode 10 having a three-terminal structure is formed.

The variable capacitance diode 10 is a diode utilizing a phenomenon that a capacitance is changed by an effect similar to a change in a space between electrodes of a capacitor due to a change in a width of a depletion layer at a pn junction by voltage application to the pn junction. Specifically, an impurity concentration distribution at the pn junction is appropriately selected so as to increase dependence of the capacitance on the voltage.

Moreover, the two $p^-$ type impurity regions 12 are connected to each other through the resistance Ri. The resistance Ri may be a diffusion region where p type or $n^-$ type impurities are diffused into the substrate 11, or may be polysilicon patterned on the substrate 11 through an insulating film. An impedance of the resistance Ri is sufficiently high with respect to a frequency used between the first and second anode terminals A1 and A2, and is several ten KΩ (for example, 10 KΩ to 10 MΩ).

As shown in FIG. 1B, the variable capacitance diode 10 of this embodiment is obtained by connecting the resistance Ri having a high impedance between the first and second anode terminals A1 and A2 and by sealing the above components in one package. The three external terminals are the first anode terminal A1, the second anode terminal A2 and the common cathode terminal CA. The capacitance is changed by applying a predetermined voltage VT to the common cathode terminal CA.

The variable capacitance diode 10 is preferable for use in an LC resonant circuit. As an example of the LC resonant circuit, description will be given below of the case where a tuning circuit is formed by use of a tuner IC and the like.

FIG. 2 shows an example of a circuit in which a direct-current bias is applied to an IC through a coil in an LC resonant circuit in the case where the first and second anode terminals A1 and A2 of the variable capacitance diode 10 are used in being grounded for direct current.

FIG. 2 is a circuit diagram showing, for example, an oscillator tuning circuit (frequency selection circuit) 100 which uses the variable capacitance diode 10 shown in FIGS. 1A and 1B in the LC resonant circuit. An example of the circuit shown in FIG. 2 is an FM tuner or the like.

As described above, the variable capacitance diode 10 includes: the common cathode terminal CA in which the cathodes of the two variable capacitance diodes D1 and D2 are connected to each other; and the first and second anode terminals A1 and A2. Moreover, the variable capacitance diode 10 is an element in which the resistance Ri is connected between the first and second anode terminals A1 and A2, and in which the components described above are integrated in one chip and are sealed. The predetermined voltage VT is applied to the common cathode terminal CA through the resistance Ri.

The first and second anode terminals A1 and A2 of the variable capacitance diode 10 are at potentials lower than the voltage VT applied to the common cathode terminal CA. In this embodiment, the second anode terminal A2 is directly grounded, and the first anode terminal A1 can be grounded through the resistance Ri included in the variable capacitance diode 10.

A capacitor Cb is connected to the first anode terminal A1, and one end of a coil L1 is connected to the capacitor Cb at a connection point P11. Thus, a signal line in which a high-frequency signal is set at H level (high impedance for AC (alternating current)) is formed by the LC resonant circuit. Moreover, the other end of the coil L1 in which the high-frequency signal is set at L level (low impedance for AC) is connected to one end of a capacitor C1 at a connection point P12, and is connected to a terminal B to which a direct-current bias is applied. The other end of the capacitor C1 is grounded. The coil L1 is a coil (such as a solenoid) having a simple structure, such as a so-called wound coil and a spring coil.

Thus, the parallel LC resonant circuit is configured of a combined capacitance obtained by series connection of the variable capacitance diode 10 and the capacitors Cb and C1, and inductance of the coil L1. A resonance frequency of a desired receiving frequency is selected by use of the voltage VT applied to the variable capacitance diode 10, and is inputted to the IC.

The common cathode terminal CA of the variable capacitance diode 10 is at H level for the direct current (a potential higher than a GND potential for DC(direct current)). The second anode terminal A2 is directly grounded and is at L level for the direct current (the GND potential). Moreover, the first anode terminal A1 is grounded through the resistance Ri and is at L level for the direct current (the GND potential). Furthermore, the terminal B to which the direct-current bias is applied is at H level for the direct current (high potential). The capacitor Cb is connected for cutting the direct-current bias and prevents the direct-current bias applied from the terminal B from flowing toward the variable capacitance diode 10. Similarly, the capacitor C1 also prevents the direct-current bias applied to the terminal B from leaking into the ground.

In the LC resonant circuit, the signal line connected to the one end of the coil L1 (the connection point P11) to be an input terminal to the IC is set at the H level of the high-frequency signal (high impedance for AC). Moreover, the other end of the coil L1 (the connection point P12) is grounded and set at the L level of the high-frequency signal (GND for AC).

The high-frequency signal also flows toward the variable capacitance diode 10 through the capacitor Cb. Here, since part of the high-frequency signal leaking into the ground through the high resistance Ri mounted in the variable capacitance diode 10 is very little, it can be ignored.

Figure 5A:
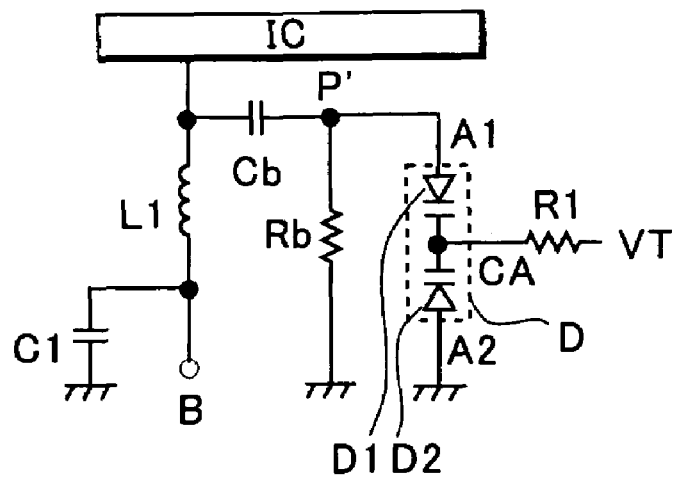
FIGS. 5A and 5B are circuit diagrams showing conventional technologies.

As described above, in this embodiment, the resistance Ri is mounted in the variable capacitance diode 10. Thus, when a bias is applied to the IC through the resonant coil in the LC resonant circuit using the coil having a simple structure, such as the solenoid, the external resistance Rb, which is required in the conventional circuit configuration shown in FIG. 5A, is no longer required.

In the case of impurity diffusion, the resistance Ri is provided between the two p⁻ type impurity regions 12 of the variable capacitance diode. Moreover, in the case where the resistance Ri cannot be provided between the p⁻ type impurity regions 12, the resistance Ri can be formed of polysilicon or the like to be disposed on the chip with an insulating film interposed therebetween. Specifically, a chip size of the conventional variable capacitance diode without the resistance Rb can be maintained.

Thus, in this embodiment, it is possible to reduce a substrate mounting area for the conventional resistance Rb and to contribute to reduction in costs of an installation by reducing the number of components.

FIG. 3 shows an example of a circuit for realizing three-point tracking by use of the variable capacitance diode 10.

A circuit 200 is configured, for example, of a receiver tuning circuit and an oscillator tuning circuit, which are formed within one substrate. In the circuit 200, LC resonant circuits are connected to respective output terminals of the first and second anode terminals A1 and A2 of the variable capacitance diode 10. An example of the circuit shown in FIG. 3 is an AM tuner or the like.

An oscillator tuning circuit 201 is formed on the second anode terminal A2 side, and a receiving tuning circuit 202 is formed on the first anode terminal A1 side.

The second anode terminal A2 is grounded through a capacitor Co connected to a connection point P3. A padding capacitor Cp for correcting tracking properties is connected to the second anode terminal A2 (the connection point P3) and is connected to one end of a coil Lo on an IC side at a connection point P4. The other end of the coil Lo is connected to a terminal B, to which a direct-current bias is applied, and to one end of a capacitor C1 at a connection point P2. The other end of the capacitor C1 is grounded.

Meanwhile, the first anode terminal A1 is grounded through one end of a capacitor Cr connected to a connection point P5. Moreover, the first anode terminal is connected to one end of a coil Lr on the IC side at a connection point P6. The other end of the coil Lr is grounded. Moreover, the coil Lr is connected to the IC through a capacitor Cc. Note that the capacitor Cc may not be provided.

Thus, in the oscillator tuning circuit 201, an LC resonant circuit is configured of the coil Lo, the capacitors Cp and Co, and the variable capacitance diode 10. The other end of the capacitor Co is grounded, and the LC resonant circuit reaches GND potential for the high frequency.

Moreover, in the receiver tuning circuit 202, an LC resonant circuit is configured of the coil Lr, the capacitor Cr, and the variable capacitance diode 10. The other end of the capacitor Cr is grounded, and the LC resonant circuit reaches the high frequency GND potential. Moreover, the capacitor Cc is connected for cutting the direct-current bias.

A predetermined potential VT is applied to the common cathode terminal CA of the variable capacitance diode 10 through a resistance R1 connected to a connection point P1. Moreover, one end of a capacitor Cg is connected to the connection point P1 and the other end thereof is grounded.

A capacitance of the variable capacitance diode 10 varies along with the potential VT. Specifically, the input side of the common cathode terminal CA is at the H level as the direct-current bias. Meanwhile, the first and second anode terminals A1 and A2 are required to be at potentials lower than that of the common cathode terminal CA, and are generally grounded.

The first anode terminal A1 is grounded through the coil Lr. Meanwhile, the padding capacitor Cp is connected to the second anode terminal A2. Although a frequency is significantly drifted in a wide band, the drift in the frequency can be reduced by using the padding capacitor Cp to perform tracking at three points. However, due to the padding capacitor Cp, the second anode terminal A2 cannot be grounded.

Therefore, in the variable capacitance diode 10 of this embodiment, the second anode terminal A2 is connected to the first anode terminal A1 through the resistance Ri mounted therein. Specifically, the second anode terminal A2 can be grounded through the first anode terminal A1 and the coil Lr.

Moreover, in the LC resonant circuit, the signal lines on sides connected to the input terminal to the IC, in other words, the signal lines connected to the one ends of the coils Lr and Lo on the IC side (the connection points P4 and P6) is set at high impedance for AC as comparison with the GND potential of the high-frequency signal. Therefore, the other ends of the coil Lr and the capacitor Cr are grounded to set at the L level of the high-frequency signal (grounded for AC). Moreover, the other end of the coil Lo (the connection point P2 side) and the other end of the capacitor Co are grounded to set at the L level of the high-frequency signal (grounded for AC).

In the variable capacitance diode 10, the first and second anode terminals A1 and A2 are connected to each other through the resistance Ri. However, since a resistance value of the resistance Ri is sufficiently high (10 KΩ or more) for the high-frequency signal, the high-frequency signal can be sufficiently separated between the first and second anode terminals A1 and A2.

In the oscillator tuning circuit 201, although the other end of the coil Lo (the connection point P2) is grounded, the terminal B is connected to the connection point P2 and the direct-current bias is applied. Therefore, the direct-current bias is cut by connecting the capacitor C1 between the connection point P2 and the ground.

In the circuit described above, the common cathode terminal CA is grounded through the connection point P1. Moreover, the capacitor Cg for cutting the direct-current bias is connected to set at the L level as the high-frequency signal (grounded for AC).

Figure 5B:
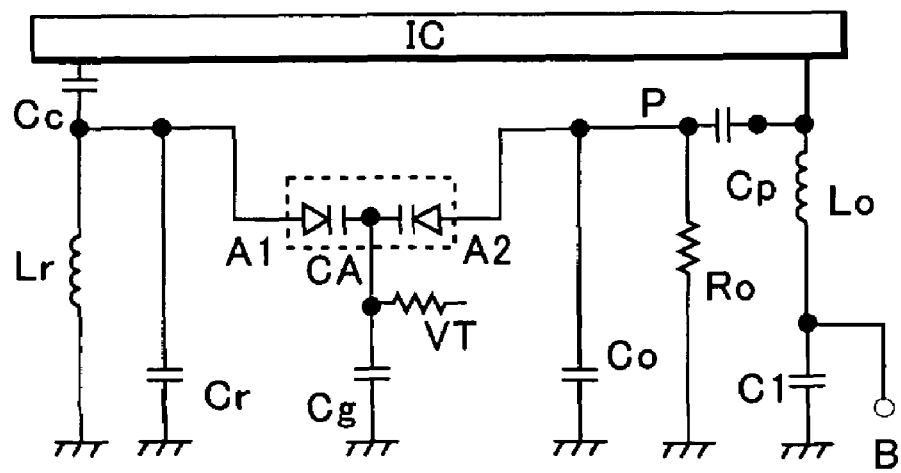

In this embodiment, the second anode terminal A2 is grounded through the resistance Ri and the coil Lr. Therefore, the resistance Ro required in the conventional circuit configuration shown in FIG. 5B is no longer required.

Thus, it is possible to reduce a substrate mounting area of the conventional bias resistance Ro and to contribute to reduction in costs of the set by reducing the number of components.

According to the present invention, the following effects are obtained.

First, in an LC resonant circuit using a coil (solenoid) having a simple structure and a variable capacitance diode, when a direct-current bias is applied to an IC through a resonant coil, a resistance for preventing a leak of a high-frequency signal and direct current grounding a first anode terminal A1 is not required. Therefore, it is possible to reduce a substrate mounting area and to contribute to reduction in costs of the set.

Secondly, in the case where a circuit for realizing three-point tracking is formed by use of the LC resonant circuit using the variable capacitance diode, a second anode terminal connected to a padding capacitor can be grounded for direct current through the mounted resistance and a coil Lr on a first anode terminal side. Thus, a resistance, connected on the second anode terminal side, for preventing a leak of a high-frequency signal and for direct current grounding of the first anode terminal is not required. Therefore, it is possible to reduce a substrate mounting area and to contribute to reduction in costs of the set.

What is claimed is:

1. A device comprising:
   two variable capacitance diodes formed in a semiconductor substrate, each of the diodes comprising an anode terminal and a cathode terminal, and the cathode terminals being connected with each other; and
   a resistance element formed in the semiconductor substrate and connecting the anode terminals,
   wherein an impedance of the resistance element is determined based on a frequency of a signal applied between the anode terminals and is 10 KΩ or higher.

2. The device of claim 1, further comprising a package containing the two variable capacitance diodes and the resistance element therein.

3. An LC resonant circuit comprising:
   two variable capacitance diodes formed in a semiconductor substrate, each of the diodes comprising an anode terminal and a cathode terminal, and the cathode terminals being connected with each other;
   a resistance element formed in the semiconductor substrate and connecting the anode terminals; and
   an LC element connected with one of the anode terminals,
   wherein another of the anode terminals is connected with a ground through an inductance element, and the one of the anode terminals is connected with the ground through the resistance element.

4. The LC resonance circuit of claim 3, further comprising a package containing the two variable capacitance diodes, the resistance element and the LC element therein.

* * * * *